United States Patent [19]
Kuijk et al.

[11] Patent Number: 5,646,760
[45] Date of Patent: Jul. 8, 1997

[54] DIFFERENTIAL PAIR OF OPTICAL THYRISTORS USED AS AN OPTOELECTRONIC TRANSCEIVER

[75] Inventors: Maarten Kuijk, Antwerp; Paul Heremans, Leuven; Roger Vounckx, Schaarbeek; Gustaaf Borghs, Kessel-Lo, all of Belgium

[73] Assignee: Interuniversitair Micro-Elektronica Centrum vzw, Leuven, Belgium

[21] Appl. No.: 420,608

[22] Filed: Apr. 12, 1995

[51] Int. Cl.$^6$ .................................................. H04B 10/00
[52] U.S. Cl. ........................... 359/152; 359/163; 257/83
[58] Field of Search .................................. 359/152, 113, 359/163, 164, 108; 257/80, 82, 83, 85; 372/38

[56] References Cited

U.S. PATENT DOCUMENTS

| | | | |
|---|---|---|---|
| 4,999,688 | 3/1991 | Hara et al. | 257/82 |
| 5,027,434 | 6/1991 | Brahms et al. | 359/152 |
| 5,153,758 | 10/1992 | Tashiro et al. | 359/124 |

OTHER PUBLICATIONS

M. Kuijk et al., "Depleted double–heterojunctionoptical thyristor," Appl. Phys. Lett. 64 (16), 18 Apr. 1994, pp. 2073–2075.

B. Knupfer et al., "Cascadable differential PnpN opoelectronic switch operating at 50 Mbit/sec with ultra–high optical input sensitivity," submitted to Electronic Letters on Dec. 2, 1994. pp. 1–11.

M. Ingels, et al., "A CMOS 18 Thz$\Omega$ 240 Mb/s Transimpedence Amplifier and 155 Mb/s LED–Driver for Low Cost Optical Fiber Links," IEEE Journal of Solid–State Circuits, vol. 20, No. 12, Dec. 1994, pp. 1552–1559.

*Primary Examiner*—Kinfe-Michael Negash
*Attorney, Agent, or Firm*—McDonnell Boehnen Hulbert & Berghoff

[57] ABSTRACT

A differential pair of optoelectronic pnpn devices provided with probing impedances allows such pair to operate as an optical to optical, optical to electrical and electrical to optical transceiver. This basic transceiver is useful in situations where information transport is needed between two or more locations, e.g., optical interconnects in electronic computing systems. The transceiver can be repeated in arrays in connection with Si-VLSI circuitry for high bandwidth optical interconnect applications.

23 Claims, 6 Drawing Sheets

DIFFERENTIAL PAIR OF OPTICAL THYRISTORS USED AS AN OPTOELECTRONIC TRANSCEIVER

FIELD OF THE INVENTION

The invention relates to differential pairs of pnpn devices, and more particularly to a way to link such a differential pair to electronic circuitry without loss of optical sensitivity and to a method for transferring the digital information between the pair and the circuitry.

BACKGROUND OF THE INVENTION

By connecting two pnpn-devices in parallel, a sensitive optical receiver-transmitter (transceiver) can be obtained, with uncritical operation with respect to temperature and bias voltages. A common resistance is connected in series with the pair to allow only one of the pnpn-devices to switch ON.

Such a system is described in Japanese Patent JP-A-3-235926. Synchronous operation is then performed, i.e., light is first input to one or both of the devices in the pair and then voltage is applied to the pair. The pnpn-device which collected the highest number of photons will turn ON and emit light. The other element will remain OFF. Information can thus be received and transmitted. A measure for the optical sensitivity is the required energy of the optical input pulses to obtain reliable detection.

In a previous pnpn-device described in International Patent Application No. PCT/BE93/00074 submitted by the present inventors entitled 'Fast Electrical Complete Turn-off Optical Device', we proposed to change the layer structure in such a way that a single pnpn-device and a differential pair of pnpn-devices can be reset quickly with a negative anode to cathode voltage pulse. See also, M. Kuijk, P. Heremans, G. Borghs and R. Vounckx: 'Depleted Double-Interojunction Optical Thyristor', Appl. Phys. Lett. vol. 64, 2073 (1994).

Complete depletion of the central base layers, which allows a high bit-rate operation without loss of optical sensitivity can be achieved. This has resulted so far in a demonstration of cascadable operation at 50 MHz and 7.4 femtojoule optical sensitivity, which is described in B. Knupfer, M. Kuijk, P. Heremans, R. Vounckx and G. Borghs: 'Cascadable Differential pnpn Optoelectronic Switch Operating at 50 Mbit/sec with Ultra-High Optical Input Sensitivity' accepted by Electr. Lttrs (Reference EU/94/45575).

Until now, the use of such pairs has been limited to optical-to-optical transceiver systems. Optical digital information synchronized with the electrical pulsed-power-supply can be received, amplified and retransmitted. Although the information undergoes an optical to electrical and an electrical to optical transformation, it is not obvious to read out or to induce the state of the differential pair electrically.

The straight-forward way to induce the state of the pair, and also to read it out, would be by contacting one of the middle layers of the pnpn-devices. Such a contact is usually called the "gate" of a pnpn device. However, the connected gate and its connected metal conductors will act as an antenna, and disturb the very sensitive operation of the pair. Moreover, if the sensitive operation with complete depletion, such as described in above-mentioned patent application 'Fast Electrical Complete Turn-Off Optical Device', is to be used, the gates of the pnpn-devices cannot be connected, since the associated base layers become completely depleted after each reset operation.

An alternative for achieving optical interconnects is to use conventional light-emitters and receivers. The light emitters would then be either lasers or LED's requiring high-current driving capability of the Si-circuitry. On the side of the light receivers, several amplifier stages are required to obtain a digital output, wasting useful Si area. See, M. Ingels, G. V. d. Plas, J. Crols and M. Steyaert: 'A CMOS 18 THz$\Omega$ 240 Mb/s Transimpedance Amplifier and 155 Mb/s LED Driver for Low-Cost Optical Fiber Links', IEEE J. of Solid-state Circuits, Vol. 29, 1552–1559 (1995).

SUMMARY OF THE INVENTION

A major aspect of the present invention is the inclusion of two probing impedances in series with the two pnpn-devices.

It is very unusual to include an impedance in series with a pnpn-device with the aim to induce the state of the pnpn-device. This construction can only be used for differential pairs of pnpn-devices.

Moreover, with the same construction, the state of the thyristor pair can be deduced. Therefore, we define two probing points, located between the pnpn-devices and their associated probing impedance.

The whole construction defines a basic transceiver for optical to optical, electrical to optical and optical to electrical conversion.

Injecting a different current at the probing points will infer a disequilibrium and induce either one or the other pnpn-device to switch, and therefore induce the state of the transceiver. In this way electrical to optical conversion is achieved.

The potential at the probing points gives a clear electrical signal of the state of the pair. Amplifying this difference with a basic amplifier corresponds to performing the optical to electrical conversion of information.

Optical to optical conversion has already been the main function of a differential pair of pnpn-devices, hence the three functions of the basic transceiver are now defined.

Due to the fact that the whole transceiver remains small, we propose to extend the fabrication into arrays with the pulsing power supply nodes tied together. In parallel construction with a Si-VLSI chip, this will give the Si-chip the opportunity to communicate optically with other such constructs achieving a very high bandwidth communication, either by free space, or by optical fiber linking.

We propose to perform the construction with one of the technologies which are being developed for combining GaAs LEDs and/or lasers with Si-circuitry. Some of the options for doing this include: epitaxial liftoff (as described by A. Ersen, I. Schnitzer, E. Yablonovitch and T. Gmitter: 'Direct Bonding of GaAs Films on Silicon Circuits by Epitaxial Liftoff', Solid-State Electr., vol. 12, 1731–1739 (1993), and J. D. Boeck, P. Demeester and G. Borghs: 'III–V on Dissimilar Substrates: Epitaxy and Alternatives', J. Vac. Sci. Technol. A., Vol 12, 995–1002 (1994)), fluidic self-assembly (described by H.-J. J. Yeh and J. S. Smith: 'Fluidic Self-Assembly for the Integration of GaAs Light-Emitting Diodes on Si Substrates', IEEE Phot. Techn. Letts., vol. 6, 706 (1994)) and by flip-chip with solder bonding, gold thermo compression or gluing under pressure.

An important advantage of applying these techniques to the proposed transceivers is that the signal currents between the Si circuitry and the transceivers is small compared to the required currents when driving arrays of LEDs and lasers. The transceiver therefore does not impose a heavy load on the Si circuitry. Hence, a separation between power supply (in the GaAs-chip) and low power signals (in the Si-chip) is obtained.

Finally, due to its differential nature the set-up has a good power supply rejection ratio independent on whether single pairs, or arrays of pairs are used, with or without Si-circuitry.

BRIEF DESCRIPTION OF THE DRAWINGS

FIG. 3 demonstrates how the fundamental transceiver unit can be repeated in array form for the case when the power supply lines are connected through.

DETAILED DESCRIPTION OF THE INVENTION

Figure 1:
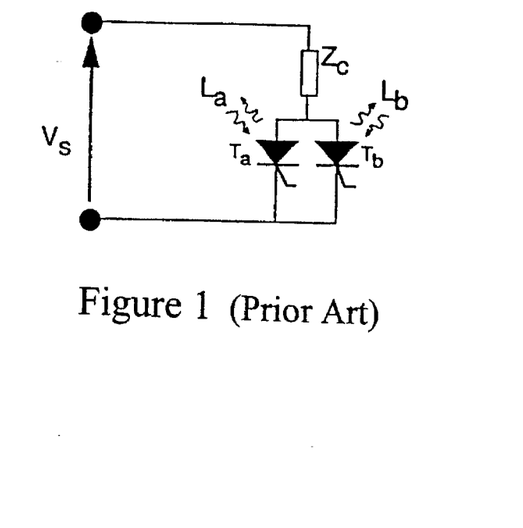
FIG. 1 is a circuit diagram of a standard differential pair of pnpn-devices.

In FIG. 1, the set-up of a general differential pair of pnpn-devices is shown. If a positive voltage $V_S$ is applied with a value higher than the breakover voltages of the pnpn devices, the voltage across the pnpn-devices at first follows the applied voltage. At a certain voltage level, the pnpn-devices start to close, and the voltage across the pnpn-devices drops (this is the negative differential transient regime) until they are completely closed. This happens when the pnpn-devices are exactly identical in all aspects, that is, they have the same structure, construction, charge content, etc. If for example, the devices are differently charged, e.g. by light input, a disequilibrium will result in a different turn-on behavior of the system. In this case, one element will switch faster, and during the aforementioned negative differential transient regime, a positive feedback will amplify the difference in charge content severely, such that the switch which started closing closes much faster than the other element, and will switch on completely. This pnpn-device is on, and the other remains off. The pnpn-device which is in its on-state, is flooded with carriers and generates light like an LED, or light like a laser, if the pnpn-device is built in a cavity and the current exceeds the threshold current of the laser.

Figure 2A:
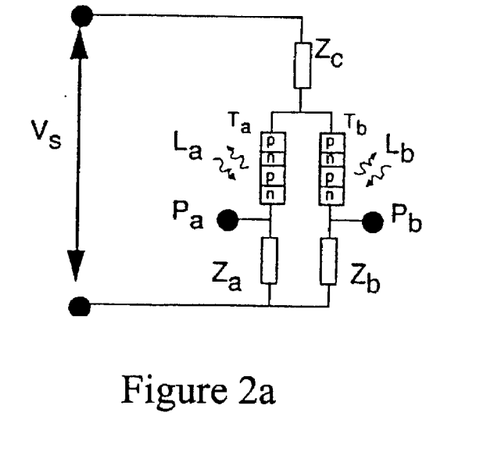
FIGS. 2a–2b are circuit diagrams showing two ways of placing probing impedances in series with their respective pnpn-device.
Figure 2B:
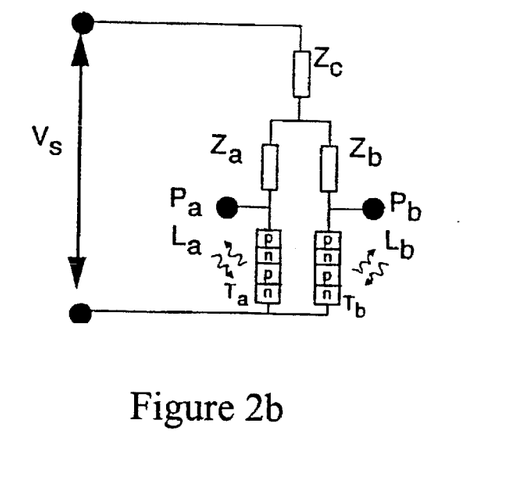
Figure 4:
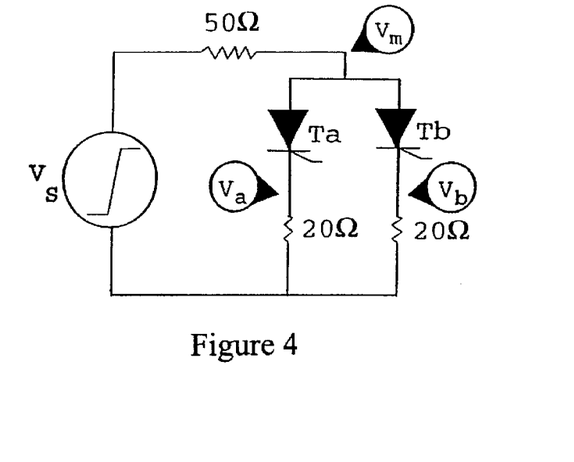
FIG. 4 is an exemplary circuit diagram of an embodiment of the invention.
Figure 5:
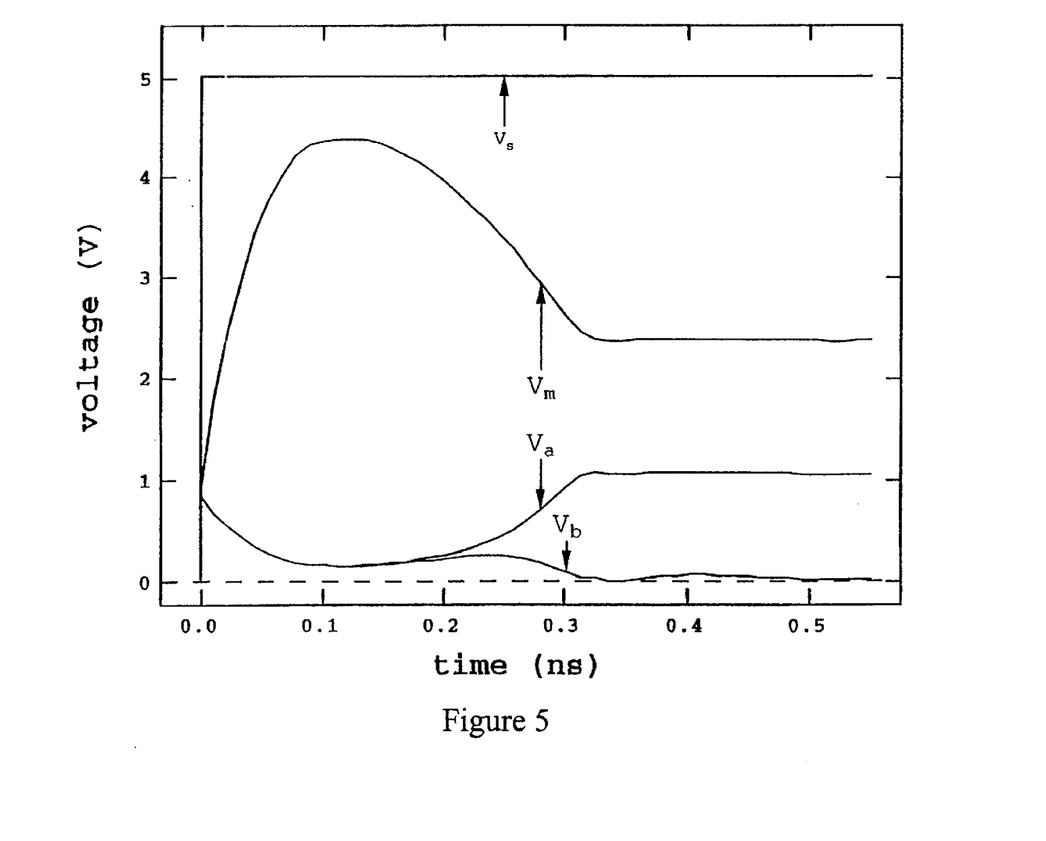
FIG. 5 is a graph showing probing point voltage after the application of light to the device.

In FIG. 2, two probing impedances $Z_a$ and $Z_b$ are added in series with the two pnpn-devices $T_a$ and $T_b$. In between the pnpn-devices $T_a$ and $T_b$ and their respective impedances $Z_a$ and $Z_b$, we define the probing nodes, $P_a$ and $P_b$. In FIG. 4 the particular set-up of such a transceiver is given for demonstration of the proposed operation by stimulation. In FIG. 5 the turn-on transient behavior of that transceiver is given by plotting versus time the applied voltage, the voltages at the probes ($V_a$ and $V_b$), and the voltage $V_m$. Before 0 ns, a small light pulse is given on $T_a$ (not shown). The voltage $V_S$ is stepped to 5 V at 0 ns. At 0.1 ns the positive feedback begins, and $T_a$ starts to win. From 0.3 ns it is clear that $T_a$ has won. $T_a$ is closed, and it generates light. The probing voltages give a clear view of which pnpn-device is closed, so optical to electrical conversion is obtained by read-out of this voltage difference. If there were no light input, a small current injection at one of the probing points somewhere between 0 ns and 0.3 ns would deliver a similar transient behavior.

Figure 6:
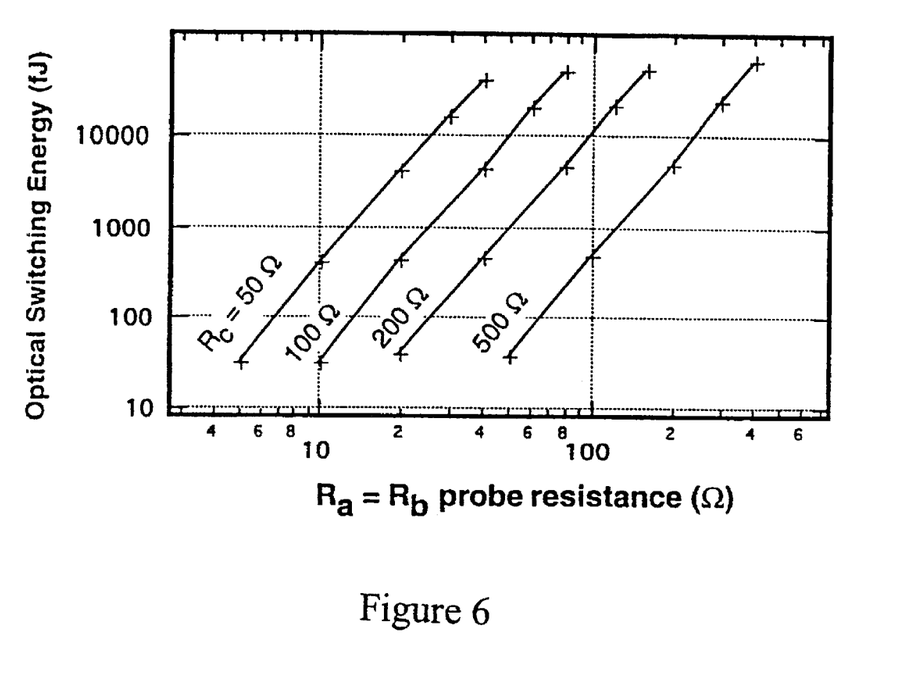
FIG. 6 is a chart showing the optical switching energy versus the probe resistance and the common resistance.
Figure 7A:
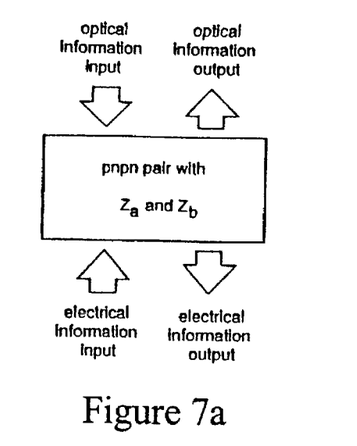
FIG. 7a shows the optical and electrical input and output flow of a pnpn-device.
Figure 7B:
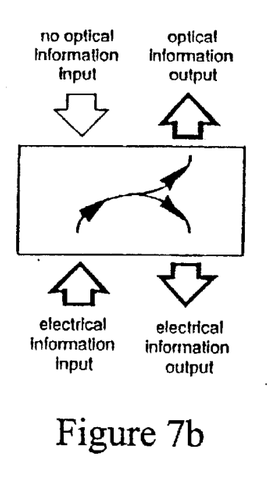
FIG. 7b shows input information delivered electrically to a pnpn-device.
Figure 7C:
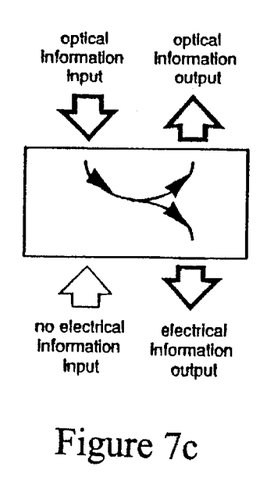
FIG. 7c shows input information delivered optically to a pnpn-device.
Figure 7D:
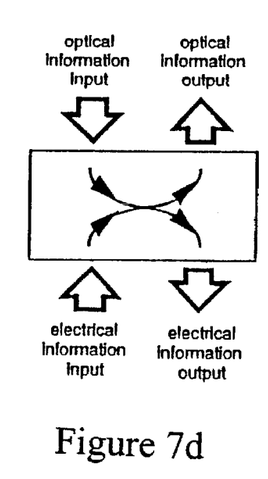
FIG. 7d shows both optical and electrical inputs applied to a pnpn-device, whereby the information of the strongest signal will prevail and will be connected through to the outputs.

A question which arises is to what degree the sensitivity is lowered due to added probe impedances. Therefore we calculated the effect for the case when the probing and the common impedances are purely resistive. Also the two probing resistances are chosen to be equal ($R_a=R_b$). In FIG. 6 one can see that for a given common resistance, the optical switching energy increases exponentially when increasing the probe resistance value linearly. This can be conceptually understood by recognizing the fact that the amplification in the positive feedback loop is lowered by the probing resistances. A second phenomenon is that the optical switching energy, and hence the sensitivity, is in fact a function of the ratio $R_c/R_a$. This is important, since for higher frequency operation (and for fixed device area), one has to lower the resistances to obtain general lower RC-time values.

The knowledge that the same ratio $R_c/R_a$ will deliver the same sensitivity is very important. To read out the state of the transceiver electrically for the optical to electrical conversion, we propose to look at the voltages at the probing points. Here a trade-off appears between the obtained voltage difference and the optical switching energy. For higher $R_c/R_a$ ratios, there are better optical switching energies, while for lower $R_c/R_a$ ratios there are larger voltage differences between the probing points. However, there exists a window of $R_c/R_a$ ratios where good sensitivity can be obtained together with a large enough voltage difference between the probing points.

In FIG. 7, the data-flow possibilities are stated schematically. In fact, our basic transceiver has an optical input, an optical output, an electrical input, and an electrical output.

Independent from which side the input was provided, the output is always two-fold: the state of the transceiver can always be read out by the light output and the voltage at the probing points. At the input side, there can be a light input and an electrical input at the same time. The resulting state of the transceiver depends on the strongest signal. If there is no optical input, the electrical input is taken, and vice versa. If no inputs are given, the output is random, or invalid (e.g., both pnpn-devices turn ON). If overruling by optical input is desired, then the optical input is to be designed stronger than the electrical input, and vice versa.

Figure 3:
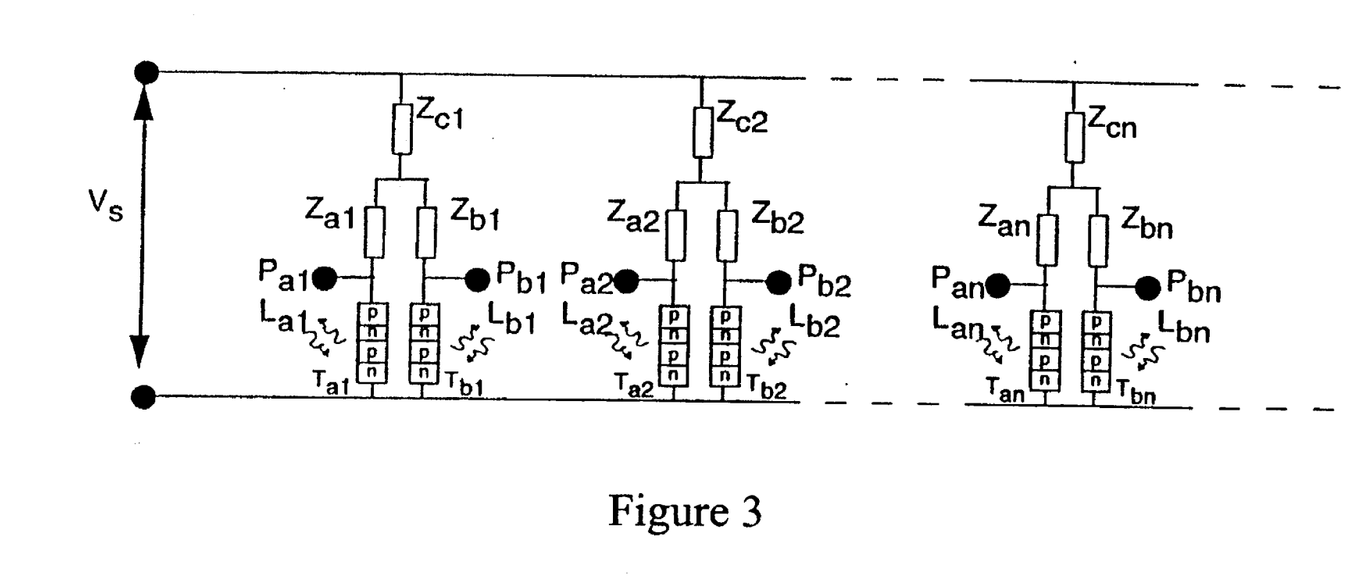

This way of constructing a basic transceiver for optical interconnects requires very small area, and it is therefore perfectly suited for array construction. Multi-channel operation can then be achieved. To have multiple channels operating with the same synchronizing power supply, the power supply lines can be wired through, such that only one power supply is necessary for a larger number of pixels. This is demonstrated in FIG. 3. If such an array is flip-chipped with Si-VLSI, the probing points can be connected with the Si-circuitry, and the power supply can eventually be provided externally, not consuming any Si-area. A separation between power-lines and data lines is then achieved, improving electrical cross-talk at this level.

Figure 8:
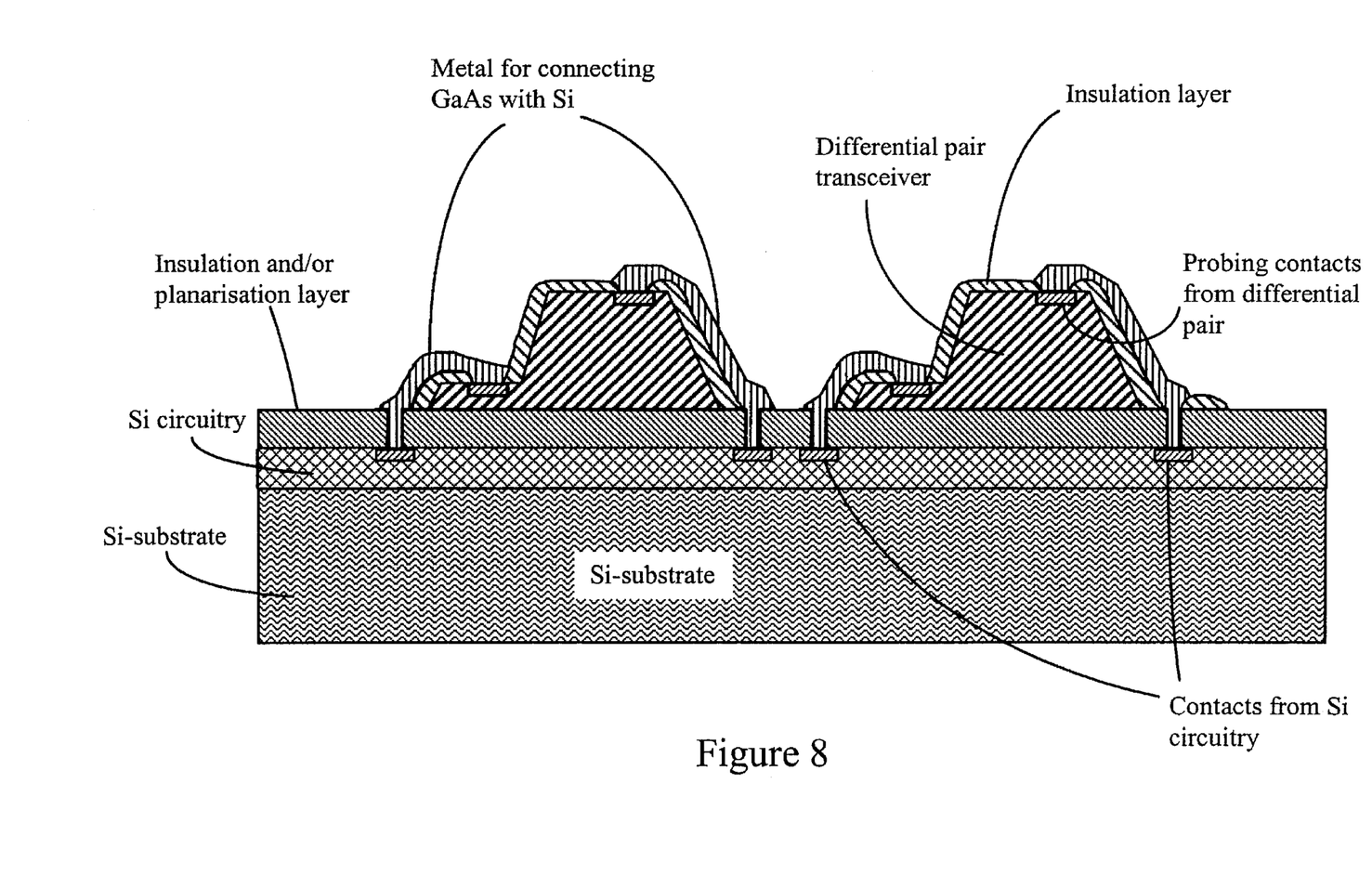
FIG. 8 shows an example of how a differential transceiver can be connected with Si-circuitry.

In order to obtain a Si-GaAs hybrid construction several options can be utilized, such as epitaxial liftoff, fluidic self-assembly, and flip-chip by solder bonding, gold thermo compression or gluing under pressure. In FIG. 8 is shown a cross-section of such a hybrid construct where, through an epitaxial liftoff, arrays of the described transceivers can be placed on a processed Si wafer. A special planarisation layer may be required to smoothen the relatively rough surface of the processed Si wafer. After placing the processed transceivers aligned on top of this prepared Si wafer, one more step is required for the hybrid electrical interconnection: A metal deposition connects the probing contacts of the transceivers with contacts at the Si-circuitry level. Eventually, the pulsing power supply of the array can be connected with drivers on the Si circuitry. If not, the supply can be provided externally.

What is claimed:

1. An optoelectronic transceiver comprising:
  a first device containing a first structure with a first S-shaped current-voltage characteristics, connected in series with a first probing impedance, forming together a first branch having a first probing point at a first point of connection between said first device and said first probing impedance;
  a second device containing a second structure with a second S-shaped current-voltage characteristics connected in series with a second probing impedance, forming together a second branch having a second probing point at a second point of connection between said second device and said second probing impedance, said first branch and said second branch being connected in parallel; and
  a common impedance having a first terminal and a second terminal, wherein said first terminal forms a first supply connection point and said second terminal is operatively connected to a first end of said parallel connection of said first and second branches, and a second end of said parallel connection forms a second supply connection point.

2. A transceiver as recited in claim 1, wherein the transceiver is an optical-to-optical transceiver.

3. An array of transceivers, comprising:
  a plurality of optoelectronic transceivers according to claim 2, wherein said first supply connection points of each of the transceivers are connected together to form a first array supply connection point and said second supply connection points of each of the transceivers are connected together to form a second array supply connection point.

4. An array of transceivers according to claim 3, wherein said first and second probing points of each transceiver are connected to a substrate containing electronic circuitry.

5. The array of transceivers as recited in claim 4 wherein, said substrate is a Si-VLSI chip.

6. A transceiver as recited in claim 1, wherein the transceiver is an electrical-to-optical transceiver, wherein injection of a different current in said two probing points determines which of said first and second devices will switch ON.

7. An array of transceivers, comprising:
  a plurality of optoelectronic transceivers according to claim 6, wherein said first supply connection points of each of the transceivers are connected together to form a first array supply connection point and said second supply connection points of each of the transceivers are connected together to form a second array supply connection point.

8. An array of transceivers according to claim 7, wherein said first and second probing points of each transceiver are connected to a substrate containing electronic circuitry.

9. The array of transceivers as recited in claim 8 wherein, said substrate is a Si-VLSI chip.

10. A transceiver as recited in claim 1, wherein the transceiver is an optical-to-electrical transceiver, wherein a determination of the state of both said first device and said second device is performed by measuring a voltage of at least one of said probing points.

11. An array of transceivers, comprising:
  a plurality of optoelectronic transceivers according to claim 10, wherein said first supply connection points of each of the transceivers are connected together to form a first array supply connection point and said second supply connection points of each of the transceivers are connected together to form a second array supply connection point.

12. An array of transceivers according to claim 11, wherein said first and second probing points of each transceiver are connected to a substrate containing electronic circuitry.

13. The array of transceivers as recited in claim 12 wherein, said substrate is a Si-VLSI chip.

14. An array of transceivers, comprising:
  a plurality of optoelectronic transceivers according to claim 1, wherein said first supply connection points of each of the transceivers are connected together to form a first array supply connection point and said second supply connection points of each of the transceivers are connected together to form a second array supply connection point.

15. An array of transceivers according to claim 14, wherein said first and second probing points of each transceiver are connected to a substrate containing electronic circuitry.

16. The array of transceivers as recited in claim 15 wherein, said substrate is a Si-VLSI chip.

17. The optoelectronic transceiver as recited in claim 1 wherein, said first and second devices contain a pnpn structure.

18. An optoelectronic transceiver comprising:
  a first device having a first current-voltage characteristic that is S-shaped;
  a first probing impedance serially coupled to said first device to form a first branch having a first probing point at a first point of connection between said first device and said first probing impedance;
  a second device having a second current-voltage characteristic that is S-shaped and substantially similar to the first current-voltage characteristic; and
  a second probing impedance, substantially similar to the first probing impedance, serially coupled to said second device to form a second branch having a second probing point at a second point of connection between said second device and said second probing impedance, said second branch being connected in parallel with said first branch to form said optoelectronic transceiver.

19. The optoelectronic transceiver of claim 18, further comprising:
  a common impedance, having a first terminal operatively connected to a first end of said parallel connection of said first and second branches, and having a second terminal that forms a first supply connection point; and wherein, a second end of said parallel connection of said first and second branches forms a second supply connection point.

20. The optoelectronic transceiver as recited in claim 19 wherein, said optoelectronic transceiver is used as an optical-to-optical transceiver to optically detect a difference between a first intensity of light directed at said first device and a second intensity of light directed at said second device.

21. The optoelectronic transceiver as recited in claim 19 wherein, said optoelectronic transceiver is used as an electrical-to-optical transceiver by injecting a first current into said first probing point that is different from a second current injected into said second probing point.

22. The optoelectronic transceiver as recited in claim 19 wherein, said optoelectronic transceiver is used as an optical-to-electrical transceiver to electrically detect a difference between a first intensity of light directed at said first device and a second intensity of light directed at said second device.

23. The optoelectronic transceiver as recited in claim 19 wherein, said first and second devices contain a pnpn structure.

* * * * *